United States Patent [19]

Tsui et al.

[11] Patent Number: 5,506,517

[45] Date of Patent: Apr. 9, 1996

[54] OUTPUT ENABLE STRUCTURE AND METHOD FOR A PROGRAMMABLE LOGIC DEVICE

[75] Inventors: Cyrus Y. Tsui, Los Altos; Albert L. Chan, Palo Alto; Ming C. Hsu, San Ramon, all of Calif.

[73] Assignee: Lattice Semiconductor Corporation, Hillsboro, Oreg.

[21] Appl. No.: 342,675

[22] Filed: Nov. 21, 1994

Related U.S. Application Data

[63] Continuation of Ser. No. 115,475, Sep. 1, 1993, abandoned.

[51] Int. Cl.[6] ............................................. H03K 19/177
[52] U.S. Cl. ............................................. 326/39; 326/56
[58] Field of Search ............................ 340/825.83, 825.71; 307/465, 243; 326/39, 40, 41, 56; 327/407

[56] References Cited

U.S. PATENT DOCUMENTS

| | | | |
|---|---|---|---|
| 4,706,216 | 11/1987 | Carter | 307/465 |
| 4,717,912 | 1/1988 | Harvey et al. | 340/825.83 |
| 4,758,746 | 7/1988 | Birkner et al. | 326/40 |
| 4,771,285 | 9/1988 | Agrawal et al. | 340/825.83 |
| 4,896,296 | 1/1990 | Turner et al. | 307/465 |
| 4,963,768 | 10/1990 | Agrawal et al. | 307/465 |
| 5,015,885 | 5/1991 | El Gamal et al. | 326/41 |
| 5,185,706 | 2/1993 | Agrawal et al. | 307/465 |
| 5,231,312 | 7/1993 | Gongwer et al. | 307/465 |
| 5,245,226 | 9/1993 | Hood, Jr. et al. | 307/465 |
| 5,302,865 | 4/1994 | Steele et al. | 307/465 |

*Primary Examiner*—Edward P. Westin
*Assistant Examiner*—Benjamin D. Driscoll
*Attorney, Agent, or Firm*—Skjerven, Morrill, MacPherson, Franklin & Friel; Edward C. Kwok

[57] ABSTRACT

An output enable structure and a method for providing output capability to an input/output cell of a programmable logic device are shown. In one embodiment, one of two global output enable signals, a test output enable signal, and two product term output enable signals is selected for controlling an output buffer of an I/O cell. Additional pin-out flexibility is provided by routing the input signal received at an I/O pin to neighboring I/O cells.

20 Claims, 18 Drawing Sheets

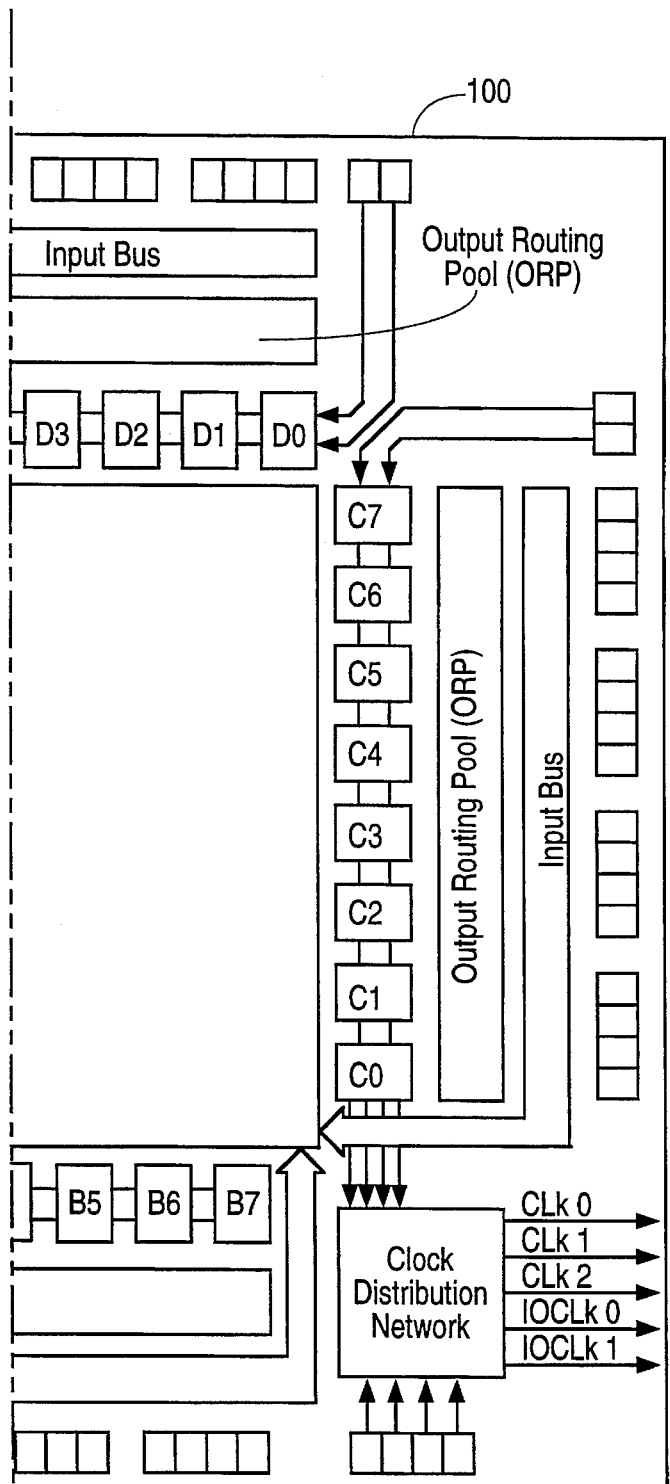
FIG. 1A(ii)
(PRIOR ART)

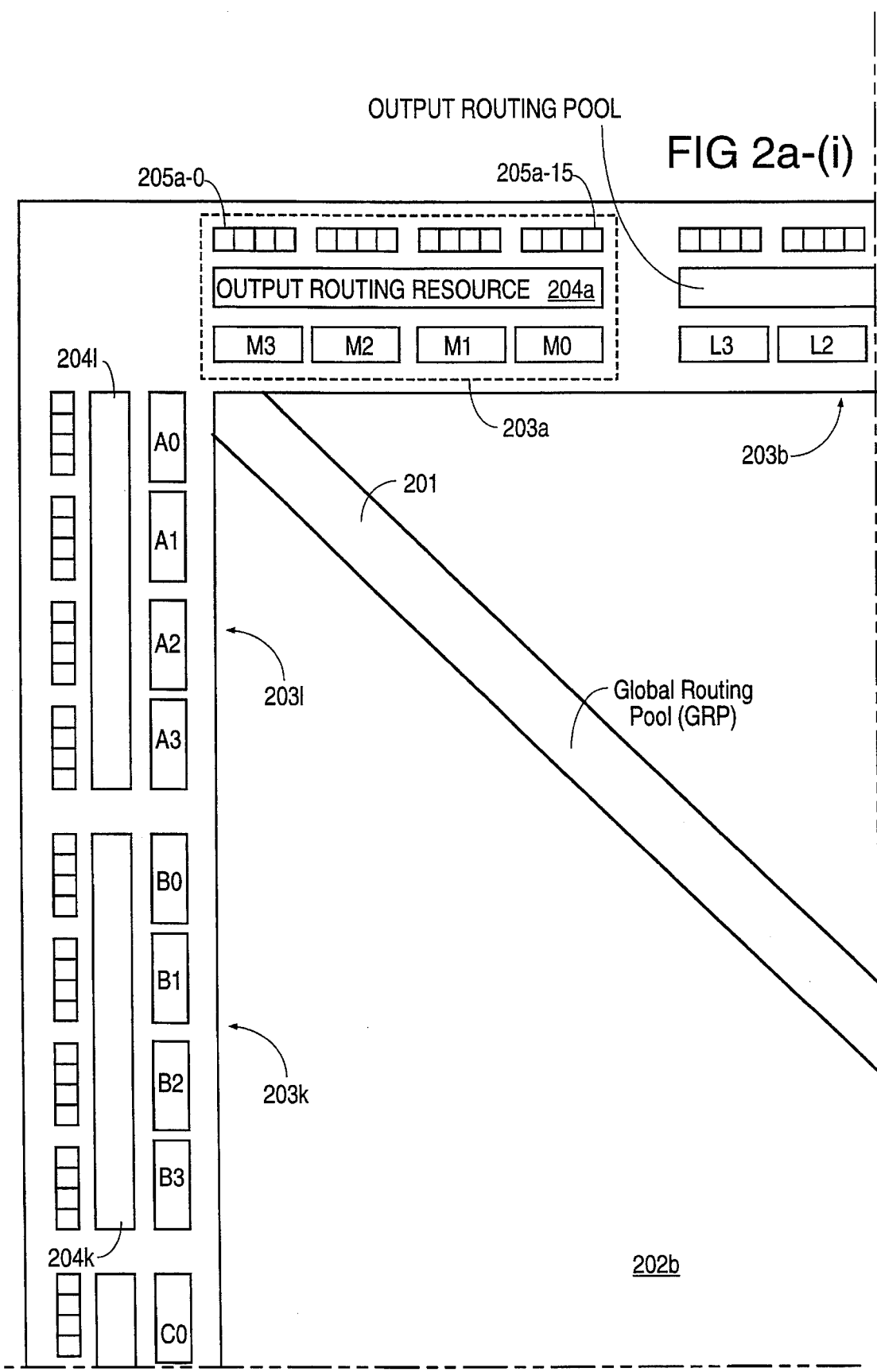

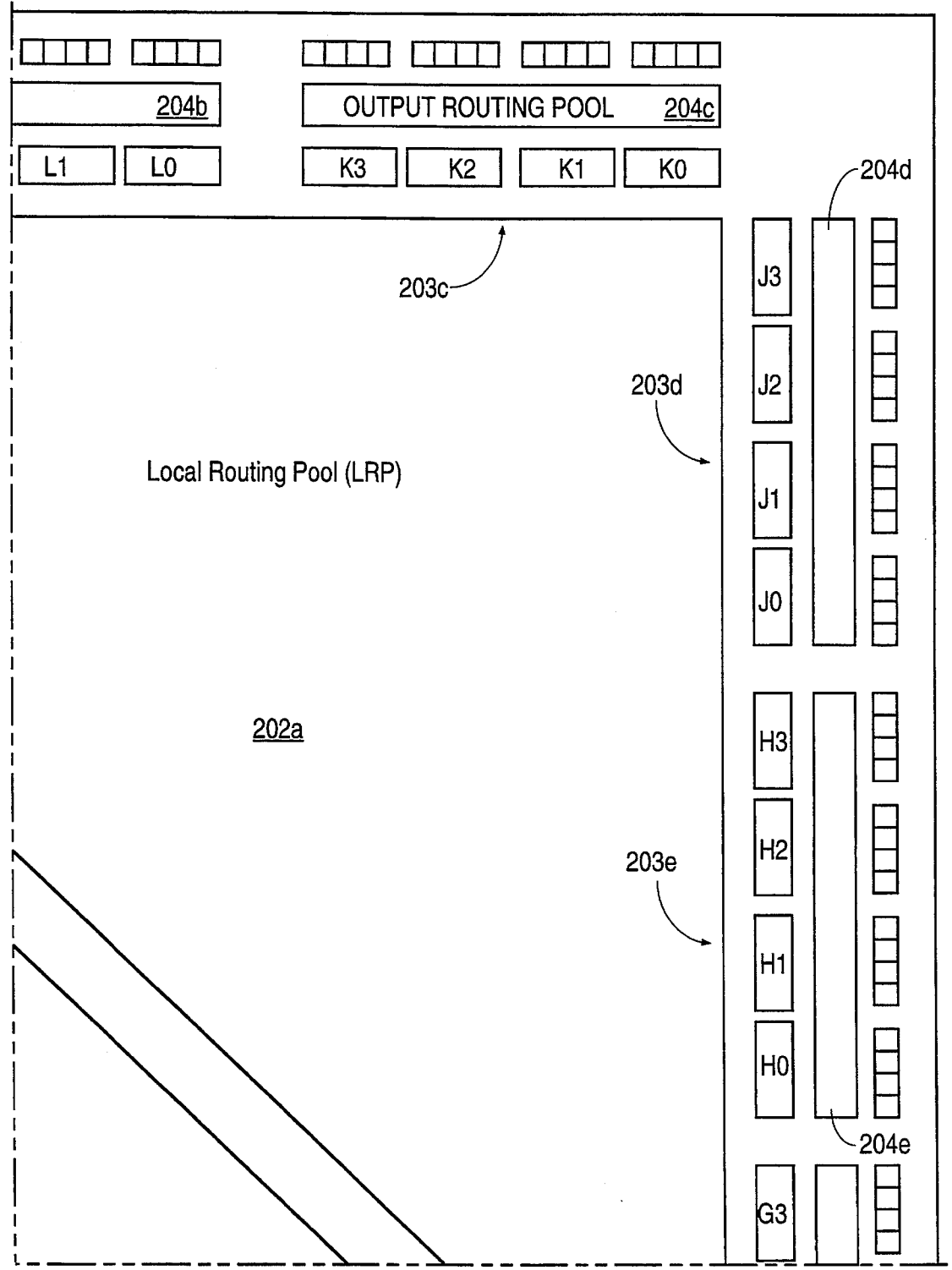
FIG 2a-(ii)

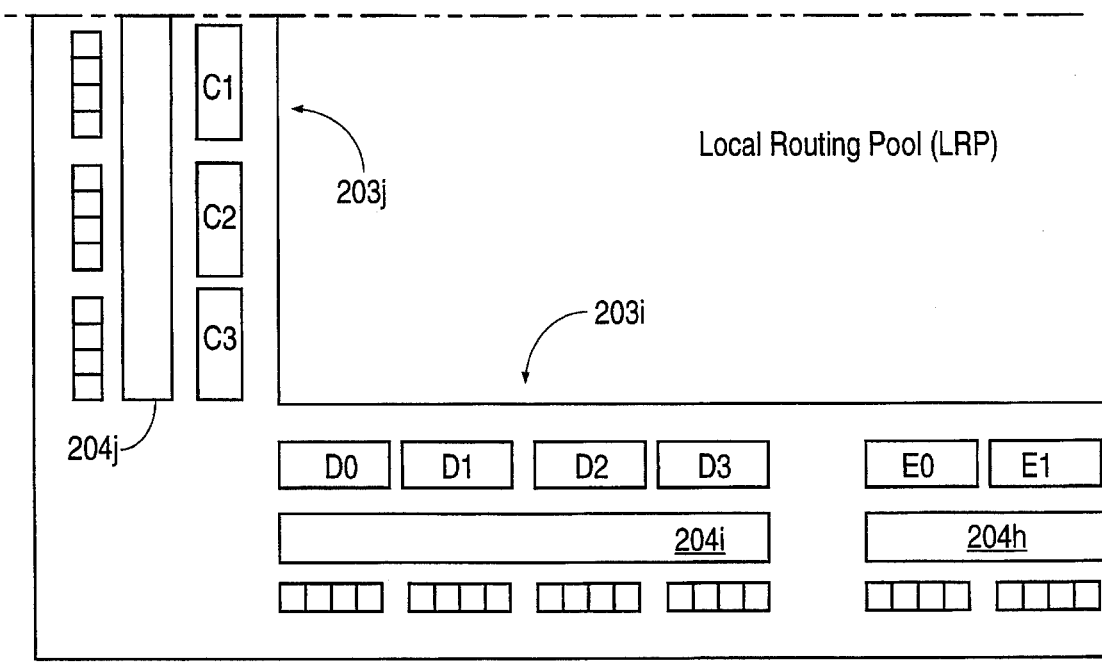
FIG 2a-(iii)

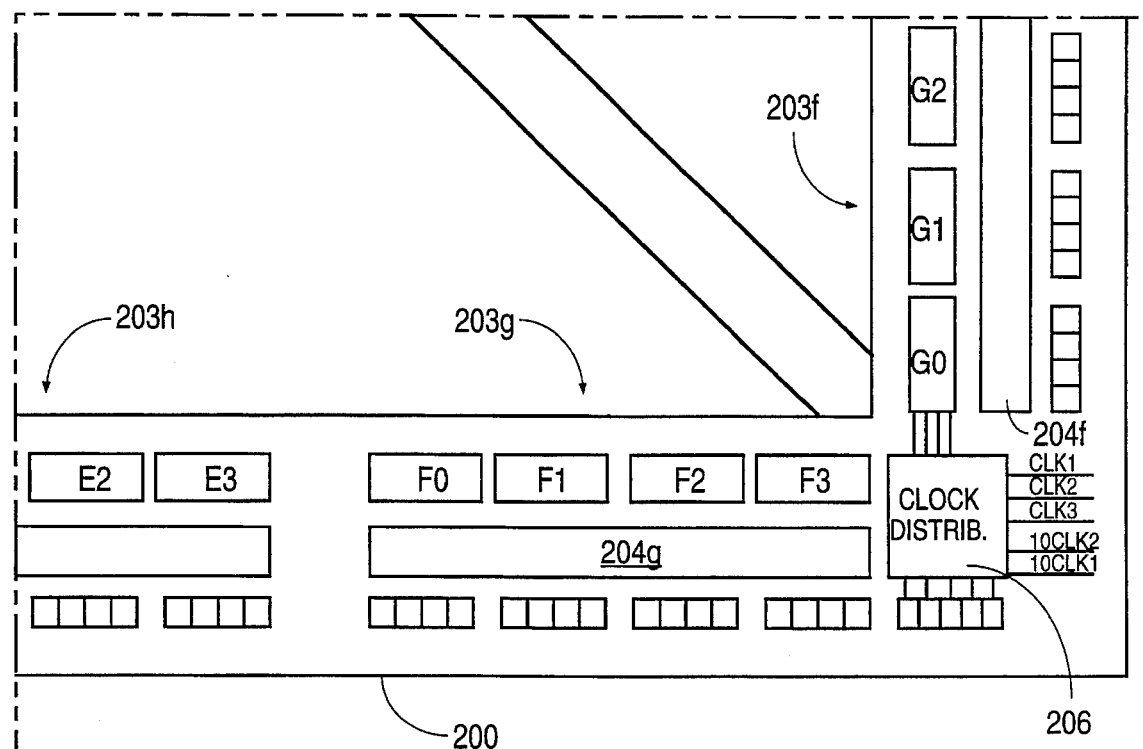
FIG 2a-(iv)

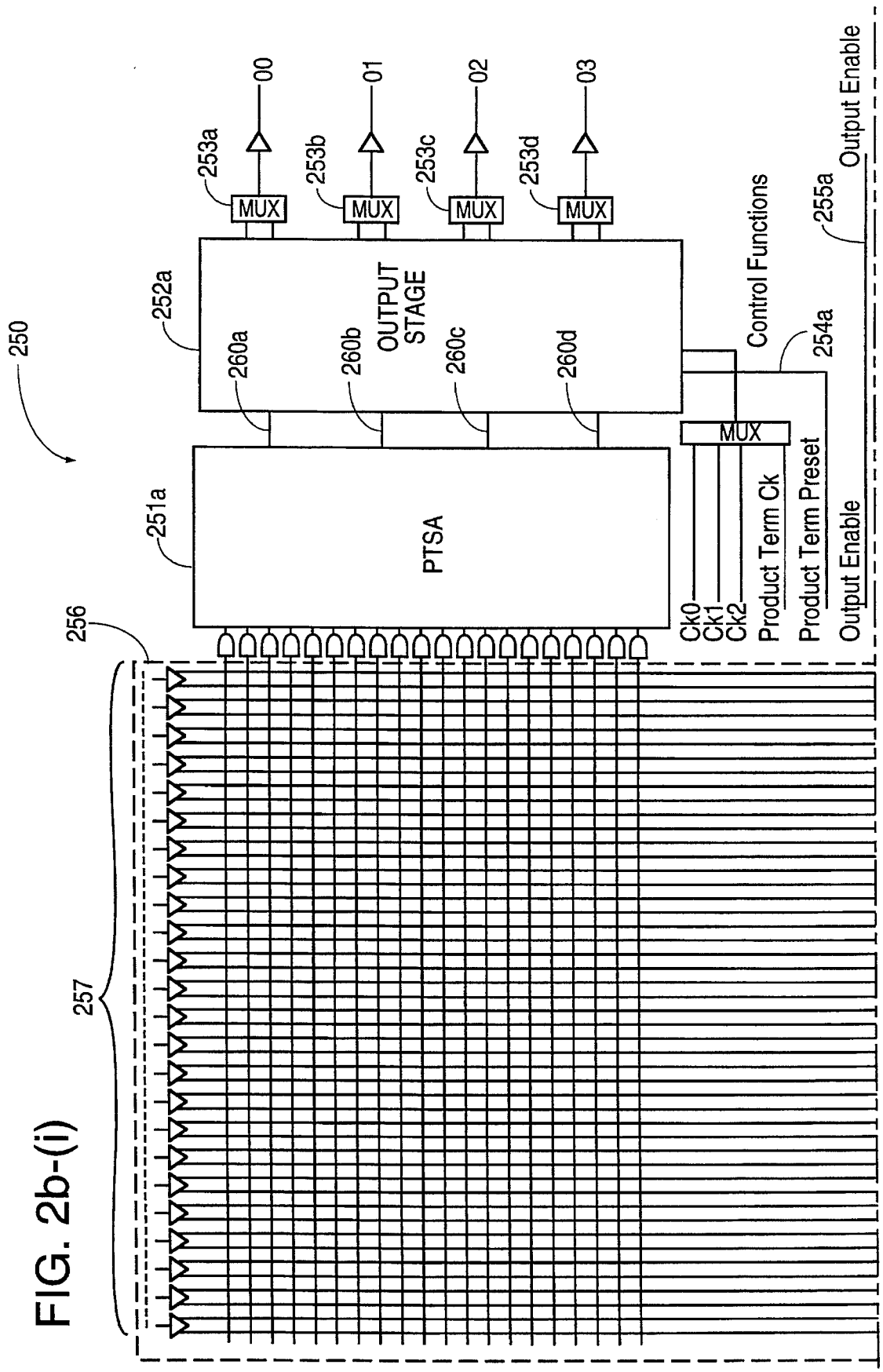
FIG. 2b-(i)

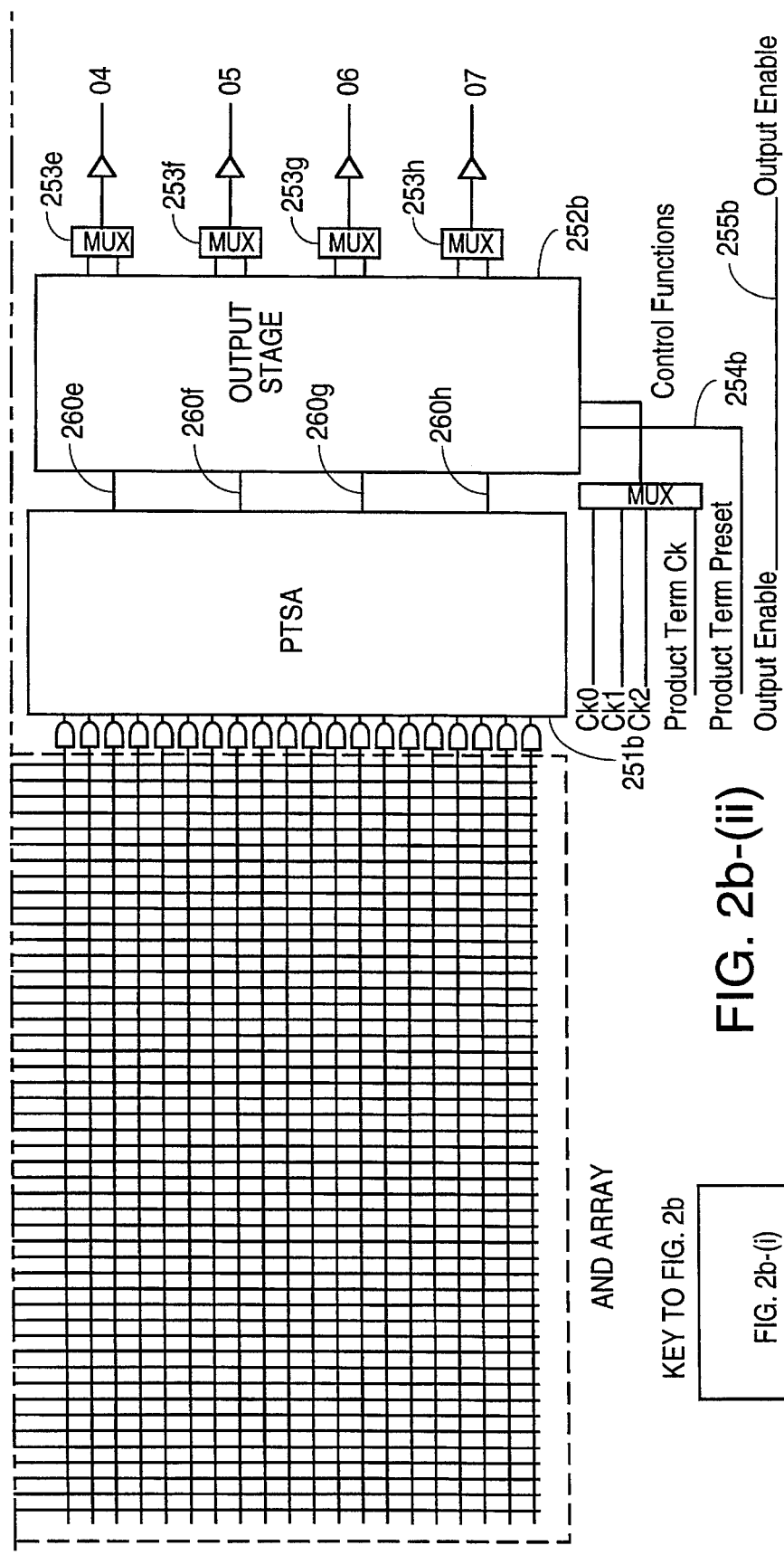
FIG. 2b-(ii)

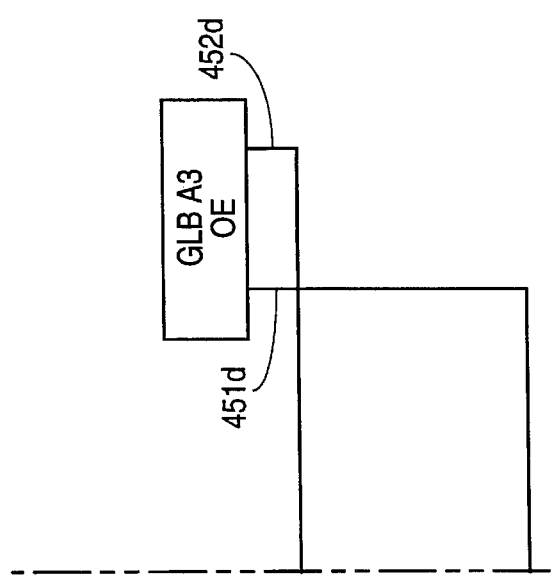
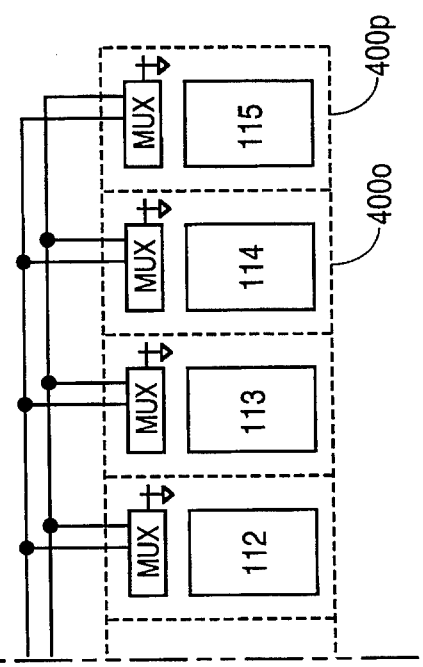
FIG. 4b(ii)

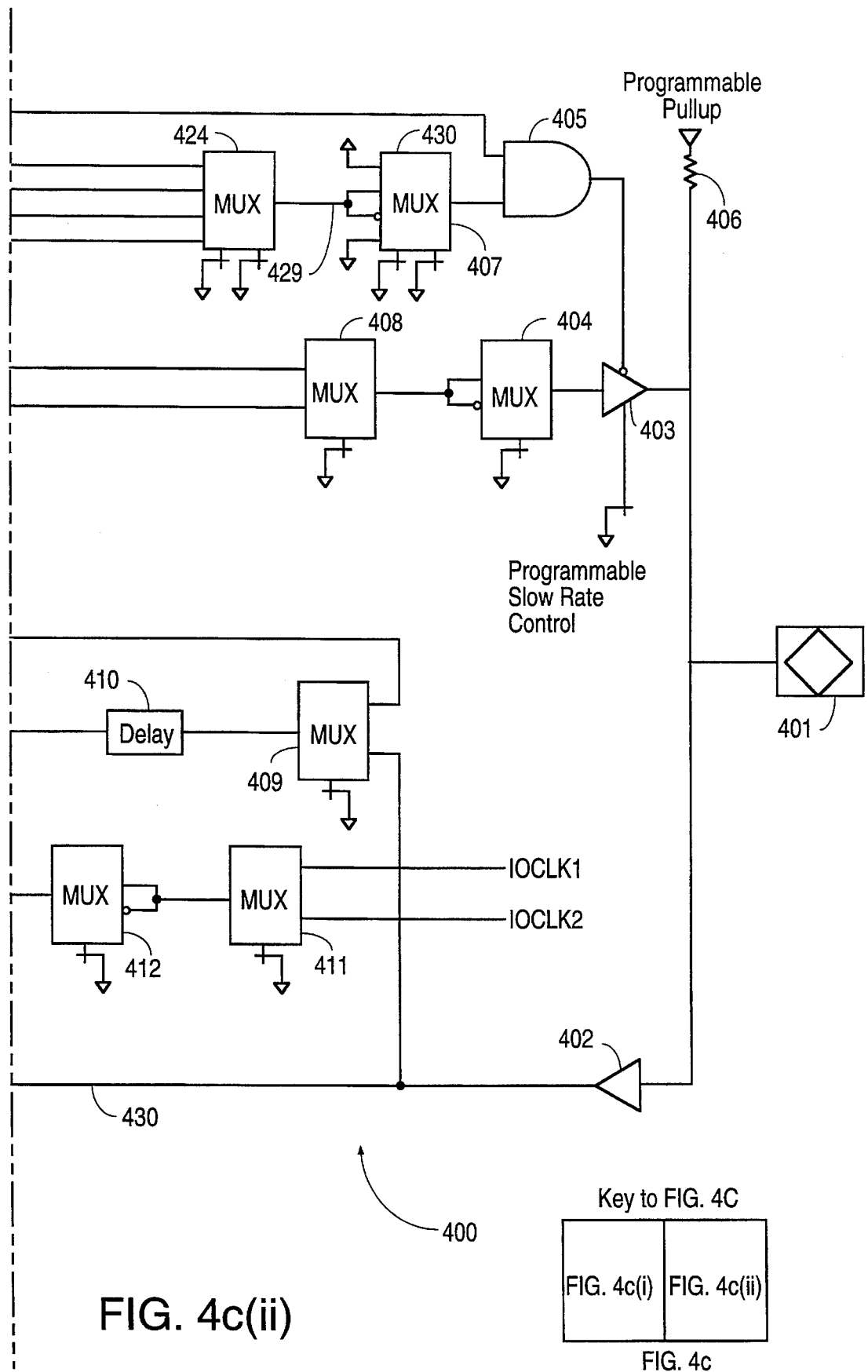
FIG. 4c(ii)

OUTPUT ENABLE STRUCTURE AND METHOD FOR A PROGRAMMABLE LOGIC DEVICE

This application is a continuation of application Ser. No. 08/115,475, filed Sep. 1, 1993, now abandoned.

BACKGROUND OF THE INVENTION

1. Field of the Invention

The present invention relates to programmable logic circuits, and in particular, relates to the configuration of input/output resources in a programmable logic circuit.

2. Discussion of the Related Art

Two examples of high density programmable logic arrays are the programmable Large Scale Integration (pLSI) devices and the in-system programmable Large Scale Integration (ispLSI) devices from Lattice Semiconductor Corporation, Hillsboro, Oreg. An ispLSI device is reprogrammable in its application without being removed from the circuit board. In-system programming techniques are discussed in U.S. Pat. Nos. 4,855,954 (entitled "In-system Programmable Logic Device with Four Dedicated Terminals" to Turner et al, issued Aug. 8, 1989), 4,761,768 (entitled "Programmable Logic Device", to Turner et al, issued Aug. 2, 1988), and 4,896,296 (entitled "Programmable Logic Device Configurable I/O Cell", to Turner et al, issued Jan. 23, 1990). The in-system programming techniques discussed in these U.S. Patents are hereby incorporated by reference. Programmable logic devices can also be implemented in both volatile and nonvolatile memory technologies (e.g. electrical eraseable programmable read-only memory or E$^2$PROM).

FIG. 1a shows a block diagram of a prior art device 100, which can be implemented as either a pLSI device or an ispLSI device. As shown in FIG. 1a, device 100 comprises 24 generic logic blocks (GLBs) A0–A7, B0–B7, C0–C7 and D0–D7. Each GLB includes a number of input terminals, a logic array for implementing logic functions and a number of output terminals. The signals at the GLB's input terminals originate either from the routing pool 101, or directly from input/output (I/O) pins, which are shown in FIG. 1 around the periphery of the device, e.g. I/O pin 102a. The signals of the output terminals of a GLB can be routed to both output routing pool 103 and routing pool 101. Output routing pool 103 routes signals between a group of GLBs and a group of I/O pins. Each I/O pin of pLSI device 100 is associated with an input/output cell ("I/O cell"), which is programmable to define whether the I/O pin is an input pin, an output pin or a bidirectional pin.

Routing pool 101 is an interconnection resource for interconnection among the GLBs. Routing pool 101 receives input signals from both the I/O pins and the output terminals of the GLBs and provides the signals received to the input terminals of the GLBs. Routing pool 101 provides connectivity between any pair of GLBs in pLSI device 100.

In FIG. 1a, four groups of GLBs A0–A7, B0–B7, C0–C7 and D0–D7 are shown. Each group of GLBs, together with its output routing pool, the associated I/O cells, and the associated I/O pins, form a structure called a "macroblock". In the prior art, the output pins (i.e. those I/O pins configured as output pins or bidirectional pins) of the macroblock are controlled by one of eight special output enable product terms (PTOEs). The output enable signal for the output pins of a macroblock is illustrated by FIG. 1b. As shown in FIG. 1b, GLBs A0– A7 of macroblock 150 generate PTOEs 151a–151h. Multiplexer 152 is programmed to select one of PTOE 151a151h as output enable signal 157 to be distributed to the I/O cells 153a–153p of macroblock 150. In each of I/O cells 153a–153p, a multiplexer (e.g. multiplexer 156a) is programmed to select either signal 157, its complement, a power signal or a ground signal to control the I/O pins of the megablock. The power and ground signals are provided to unconditionally enable and disable, respectively, signal output at the I/O pin. Of course, each I/O cell can be individually programmed. However, only one PTOE per macroblock is used to control the I/O pins of the macroblock. The remaining seven PTOEs can be used as regular logic product terms.

Under the output enable scheme of FIG. 1b, the I/O pins configured for output in a macroblock are controlled by the same PTOE signal. Further, the structure of FIG. 1b does not provide for an easy way to route this PTOE signals to other macroblocks. The inability to route a PTOE signal to another macroblock can be a significant disadvantage. This is because, in many applications, the pin-out of a programmable logic device is often defined by external factors, such as the existing design of a printed circuit board. If it is desired that the I/O pins of more than one macroblock be controlled by the same PTOE signal, the PTOE signal must be either routed through the global routing resource, at the expense of unequal signal delay at the I/O pins, or generated in every macroblock having a I/O pin to be controlled by the PTOE signal, at the expense of duplicate control circuits for generating the PTOE signals. Therefore, a less restrictive structure is desired.

SUMMARY OF THE INVENTION

In accordance with the present invention, a structure and a method provide programmable output enable signals in a programmable logic device. The programmable logic device which includes the structure of the present invention has a plurality of generic logic blocks, a plurality of input/output cells and a global signal routing resource. In one embodiment, the programmable logic device receives an external output enable signal routes the external output enable signal through said global signal routing resource to each input/output pin. Each input/output pin also receives from one or more of the logic blocks internal output enable signals, which are each product term signal derived from a plurality of logic signals. A multiplexer selects an output enable signal for the I/O cell between said internal and external output enable signals.

In another embodiment, the programmable logic device receives (i) an external output enable signal which is routed to each input/output cell through a global signal routing resource, and (ii) an internal output enable signal. A logic gate provides the output enable signal for the I/O cell by providing a logic function of said internal and external output enable signals. In that embodiment, the internal output enable signal is derived from either a product term signal generated in said logic block. The logic gate provides a level of additional flexibility for generating an output enable signal, by allowing the internally generated signal to be gated with an externally provided logic signal.

In accordance with another aspect of the present invention, the programmable logic device receives a test signal which is used to disable propagation of the output enable signal when the test signal is in an inactive state. This function is especially useful to prevent output buffers of the programmable logic device from driving an output prior to the programmable logic device achiving a known initial state during power up. This test enable signal is also used for testing purposes.

The present invention is better understood upon consideration of the following detailed description in conjunction with the accompanying drawings.

BRIEF DESCRIPTION OF THE DRAWINGS

FIG. 2a shows a programmable logic device 200 having a global routing pool 201 for providing connectivity between two local routing pools 202a and 202b.

FIG. 2b shows a typical GLB 250 of the programmable logic device 200 of FIG. 2a.

DETAILED DESCRIPTION OF THE PREFERRED EMBODIMENT

Figure 1A:
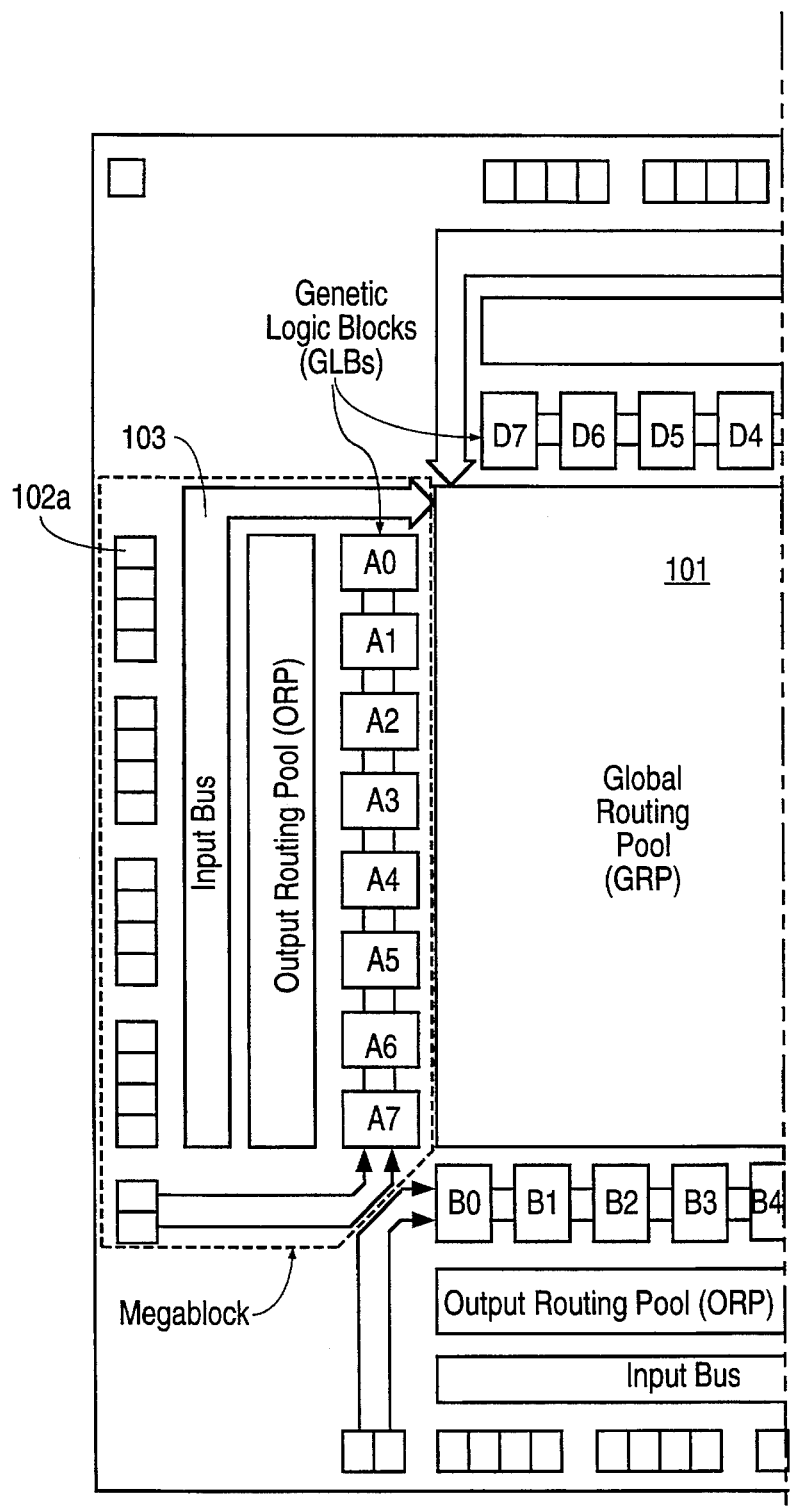
FIG. 1a shows a pLSI device 100 in the prior art using a single routing pool.
Figure 1B:
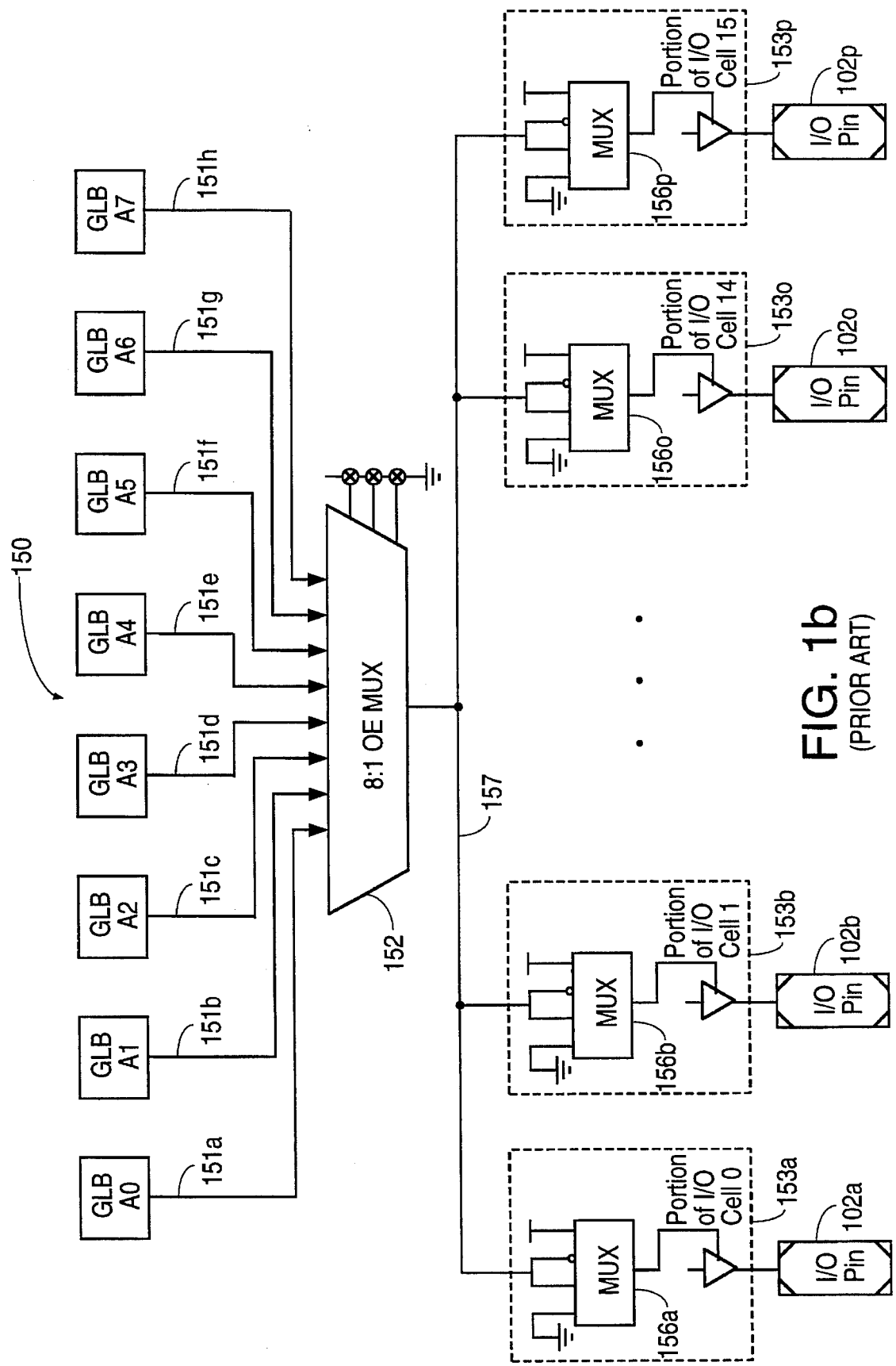
FIG. 1b shows a structure for generating output enable signals for the I/O pins for the pLSI device 100 of FIG. 1.

FIG. 2a shows, in one embodiment of the present invention, a programmable logic device 200 including 12 "megablocks" 203a–203l. Each megablock includes four generic logic blocks ("GLBs", e.g. GLB M0–M3 in megablock 203a), an output routing pool (e.g. output routing pool 204a), and 16 I/O cells (e.g. I/O cell 205a-1 or 205a-16). In addiiton, programmable logic device 200 includes a clock distribution structure 206, two local routing pools ("LRP") 202a and 202b, and a global routing pool ("GRP") 201. LRPs 202b and 202a provide connectivity among GLBs A0–F3, and GLBs G0–M3 respectively. GRP 201 provides connectivity between LRPs 202a and 202b.

Clock distribution network 206 can receive from outside programmable logic device 200 five clock signals on five dedicated clock pins. GLB G0 can also be configured to generate additional clock signal inputs to clock distribution network 206. Five clock signals (three for logic blocks, e.g. GLBs, and two for I/O cells) can be distributed from clock distribution network 206 to any GLBs or I/O cell of programmable logic device 200.

FIG. 2b shows a typical structure 250 of a GLB in programmable logic device 200. As shown in FIG. 2b, each GLB has 24 input terminals (collectively referred to as input terminals 257), eight output terminals O1–O7, and an AND array 256. Input terminals 257 carry signals to AND array 256 from the LRP (say, LRP 202a) which serves GLB 250. AND array 256 receives (a) output signals of GLBs served by LRP 202a, (b) output signals from I/O cells in the megablocks which includes GLBs served by LRP 202a, and (c) output signals received over GRP 201. The signals received over GRP 201 include output signals of GLBs served by LRP 202b, and output signals from I/O cells in the megablocks which includes the GLBs served by LRP 202b. AND array 256 also receives four internal "fast feedback" signals from the product-term sharing arrays ("PTSAs") 251a and 251b of GLB 250.

AND array 256 generates 2 groups of twenty product-term signals. Each product-term signal, which is provided both in logic true and the complement forms, is a logic product involving any number of the input signals received into AND array 256. In FIG. 2b, a first group of twenty product term signals is received by PTSA 251a, and a second group of twenty product term signals is received by PTSA 251b. Product-term sharing arrays, such as product term sharing arrays 251a and 251b, are discussed in detail in U.S. Pat. No. 5,130,574, entitled "Programmable Logic Device Providing Product Term Sharing and Steering to the Outputs of the Programmable Logic Device," to J. Shen et al, filed on May 6, 1991, issued on Jul. 14, 1992, and assigned to Lattice Semiconductor Corporation. U.S. Pat. No. 5,130,574 is hereby incorporated by reference in its entirety.

Output stage 252a includes output logic macrocells providing various programmable logic functional capabilities for generating either a registered or a combinatorial output signals of PTSA 251a. This type of logic macrocells used in output stage 252a are discussed in detail in U.S. Pat. No. 5,191,243, entitled "Output Logic Macrocell with Enhanced Functional Capabilities," to J. Shen et al, filed on May 6, 1991 and issued on Mar. 2, 1993. U.S. Pat. No. 5,191,243 is hereby incorporated by reference in its entirety.

The output signals of multiplexer 253a–253d are provided as output signals O0–O3. Output signals O0–O3 are routed back to LRP 202a or, alternatively, via the output routing pool of GLB 250's megacell to the associated I/O cells.

Figure 2C:
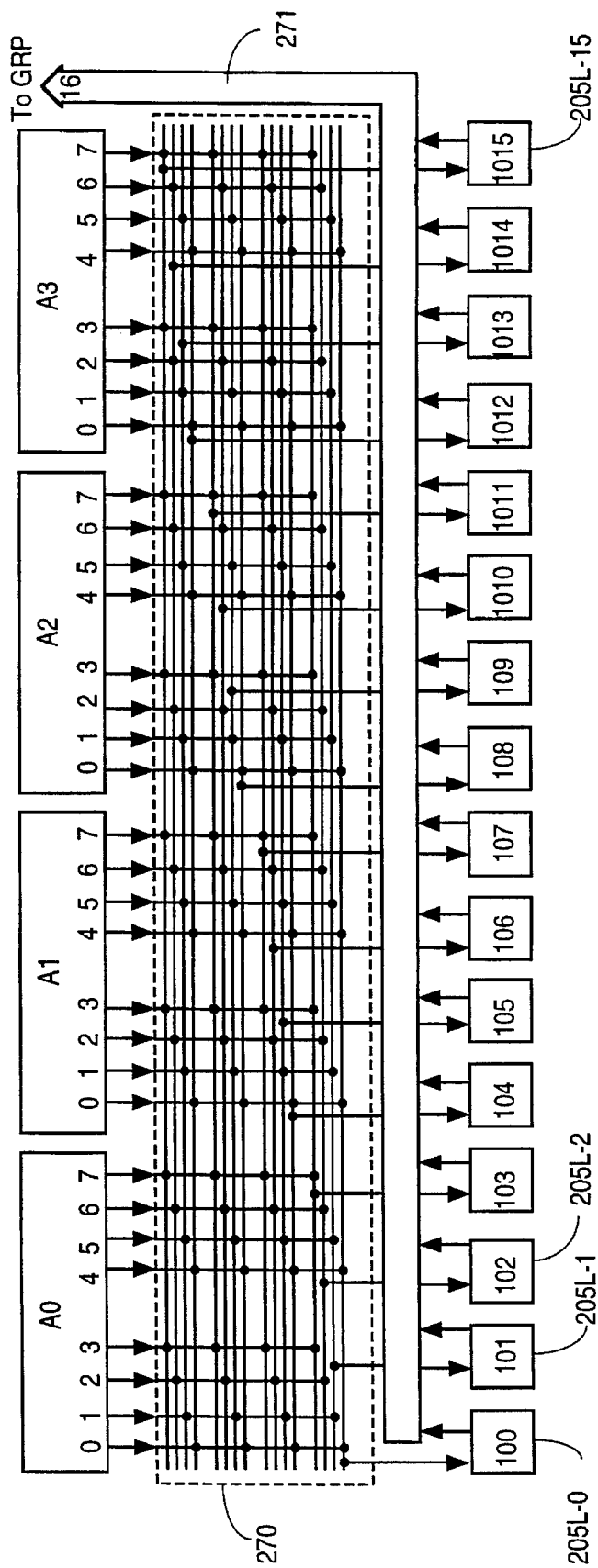
FIG. 2c shows output routing pool 204l in programmable logic device 200 of FIG. 2b.

FIG. 2c shows output routing pool 204l, which serves GLB 204l of programmable logic device 200 (FIG. 2a). As shown in FIG. 2c, GLBs A0–A3 are connected to a switch matrix 270. Switch matrix 270 receives from GLB A0–A3 their 32 output signals, and provides 16 output signals to I/O pins 205l-0 to 205l-15. Each of the 32 output signals of GLB A0–A3 is routed to four I/O cells. I/O cells 205l-0 to 205l-15 can each be configured as an input pin, an output pin, or a bidirectional pin. When configured as an input pin, the input signal received is routed via bus 271 to LRP 202b.

Figure 2D:
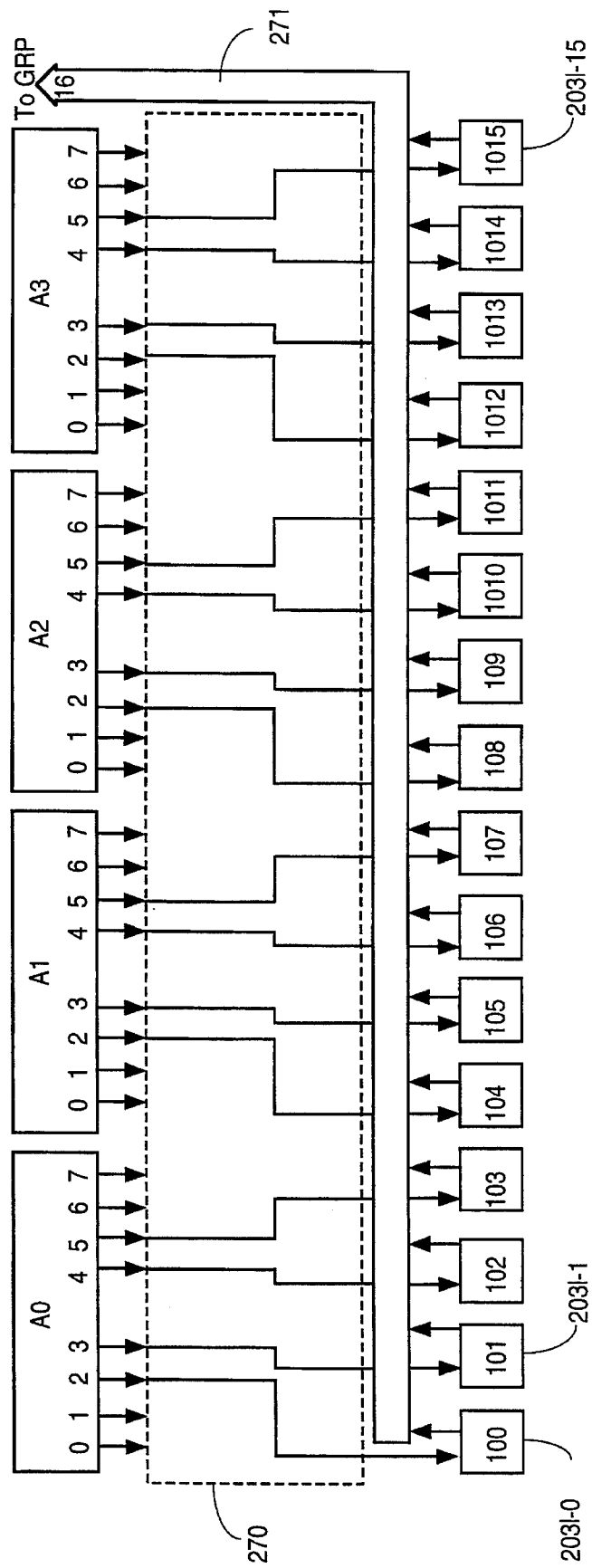
FIG. 2d shows output routing pool 204l of programmable logic device 200 of FIG. 2b, showing a bypass mechanism.

To provide higher speed connections, four of the eight output terminals of each GLB are provided programmable bypass signal paths to four I/O cells. These bypass connections are shown in FIG. 2d.

Figure 3:
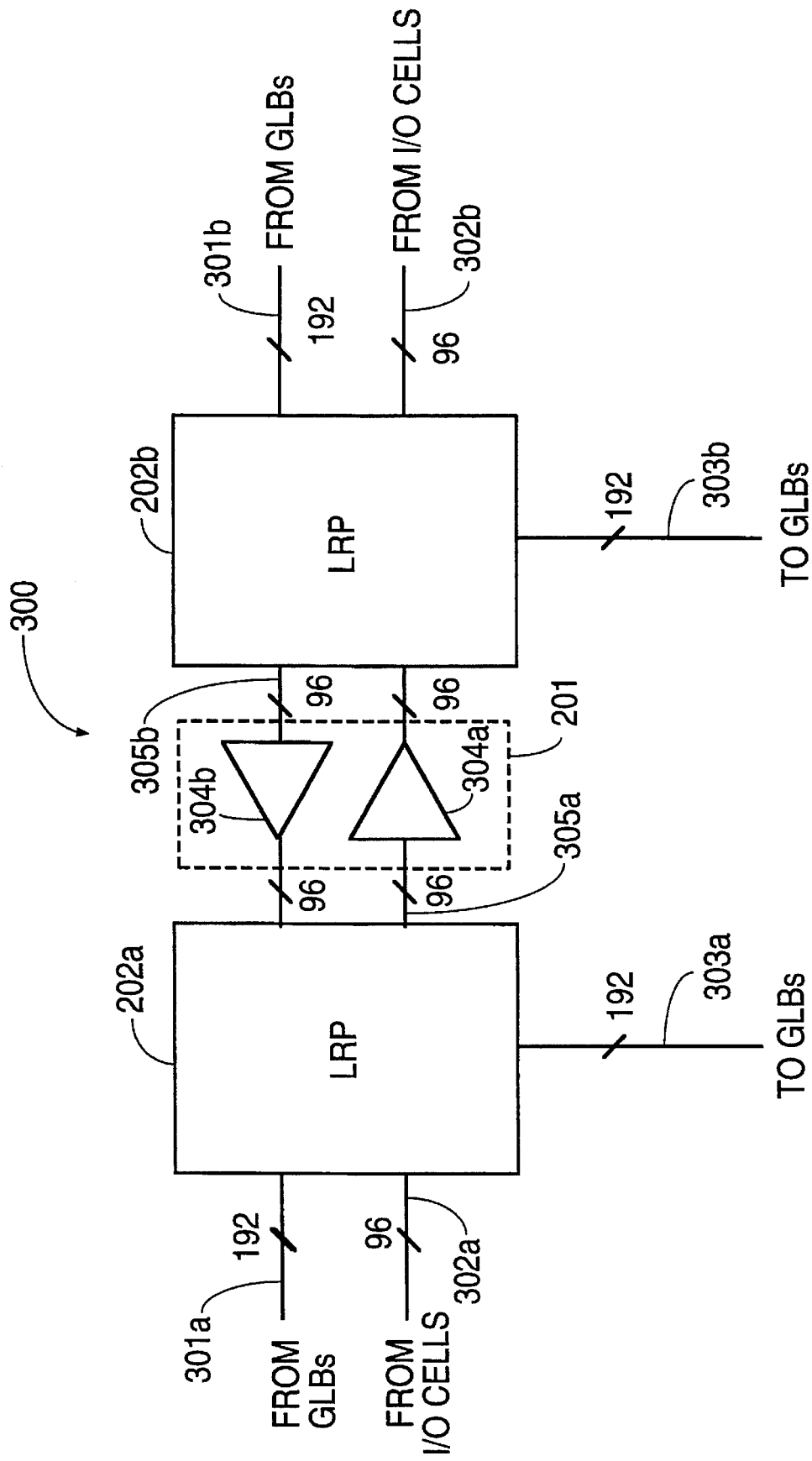
FIG. 3 shows the interconnect resources LRPs 202a and 202b, and GRP 201.

LRP 202a and LRP 202b are interconnection resources serving GLBs G0–M3, and A0–F3, as shown in FIG. 2a. FIG. 3 is a block diagram of a structure 300 implementing LRP 202a, LRP 202b, and GRP 201. As shown in FIG. 3, each LRP has (i) 96 input terminals, collectively indicated by reference numeral 302a or 302b, receiving input signals from the I/O cells associated with the GLBs served by the LRP, (ii) 192 input terminals, collectively indicated by reference numeral 301a or 301b, receiving input signals from the eight output signals from the GLBs served by the LRP, (iii) 96 input terminals, collectively indicated by reference numeral 303a or 303b, for receiving from GRP 201 signals which originate from the other LRP, and (iv) 192 output terminals, collectively indicated by reference numeral 305a or 305b, for routing each of the 288 input signals received by the LRP to 96 of the input terminals of the GLBs served by the LRP. LRP 202a and 202b are each implemented according to the interconnect structure discussed in U.S. Pat. No. 5,204,556, entitled "Programmable Interconnect Structure for Logic Blocks," by Kapil Shankar, filed May 6, 1991, issued Apr. 26, 1993 and assigned to Lattice Corporation, which is the Assignee of the present application. U.S. Pat. No. 5,204,556 is hereby incorporated by reference in its entirety. LRP 202a provides 96 output terminals to route signals through GRP 201 to LRP 202b. Likewise, LRP 202b provides 96 output terminals to route signals through GRP 201 to LRP 202a.

GRP 201 interconnects LRP 202a and 202b. To improve performance, the interconnections 305a and 305b are provided buffers, which are collectively indicated by reference numerals 304a and 304b respectively. Using GRP 201 to interconnect LRP 202a and 202b maintains connectivity between GLBs A0–F3 (served by LRP 202b) and GLBs G0–M3 (served by LPR 202b), while routing only a fraction of total number of signals received by LRPs 202a and 202b. Consequently, significant reduction of silicon area is achieved. Structure 300 can be optimally used by preferentially implementing interconnected logic circuits in GLBs served by the same LRP, thereby reducing the number of signals required to cross over via GRP 201. Under such condition, signals between GLBs are, in most cases, transmitted over an LRP, which is a smaller interconnection circuit than the alternative under a single routing pool system. Thus, despite the increase in the number of GLBs in the programmable logic device, the signal delays in transmission through the interconnection circuit are kept generally low. Because of the reduced load in the LRP, which serves a smaller number of GLBs, the AC switching currents are generally also kept low. LRP 202a and LRP 202b, and GRP 201 are each regular in structure, so that signal delays either within each LRP or over GRP 201 remain predictable and consistent.

Figure 4A:
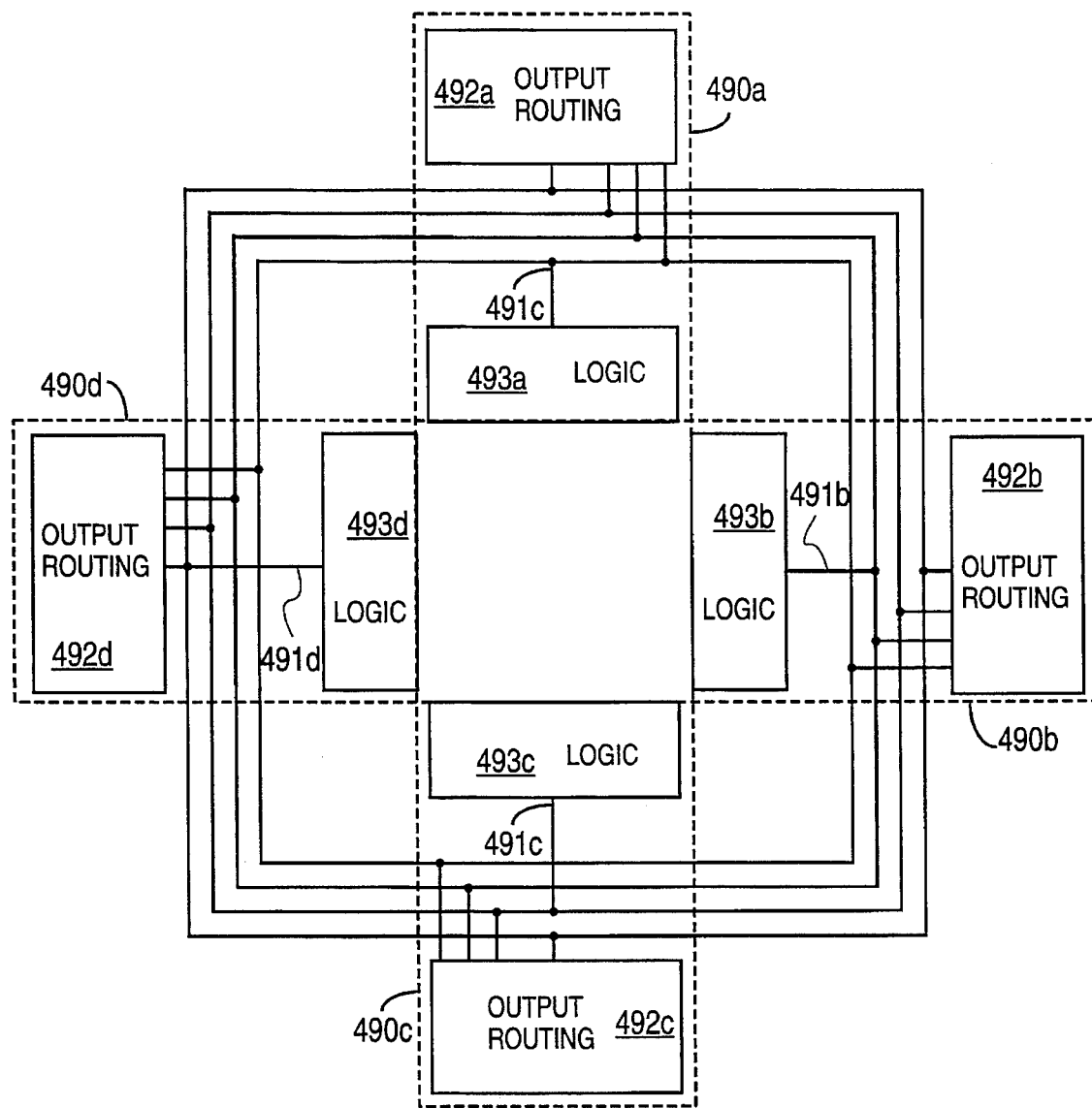
FIG. 4a shows product-term output enable (PTOE) signals 491a–491d generated in four macroblocks 490a–490d; each of PTOE signals 491a–491d is multiplexed to every one of macroblocks 490a–490d, in accordance with the present invention.

FIG. 4a shows product-term output enable (PTOE) signals 491a–491d generated in four macroblocks 490a–490d; each of PTOE signals 491a–491d is multiplexed to every one of macroblocks 490a–490d, in accordance with the present invention. In FIG. 4a, macroblocks 490a–490d each comprise a logic portion (labelled by one of reference numerals 493a–493d), and an output routing portion (labelled by one of reference numerals 492a–492d). The logic portion of the macroblock comprises GLBs, PTSA and output logic macrocells, and the output routing portion of the macroblock comprises an output routing pool, I/O cells, and I/O pins. The logic portions 493a–493d of macroblocks 490a–490d each generate a PTOE signal, labelled respectively PTOE signals 491a–491d. Signal traces 494a–494d routes each of PTOE signals 491a–491d to each of the output routing portions 492a–492d of macroblocks 490a–490d. Thus, PTOE signals 491a–491d are each provided to every one of macroblocks 490a–490d, regardless of which macroblock the PTOE signal is generated.

Figure 4B:
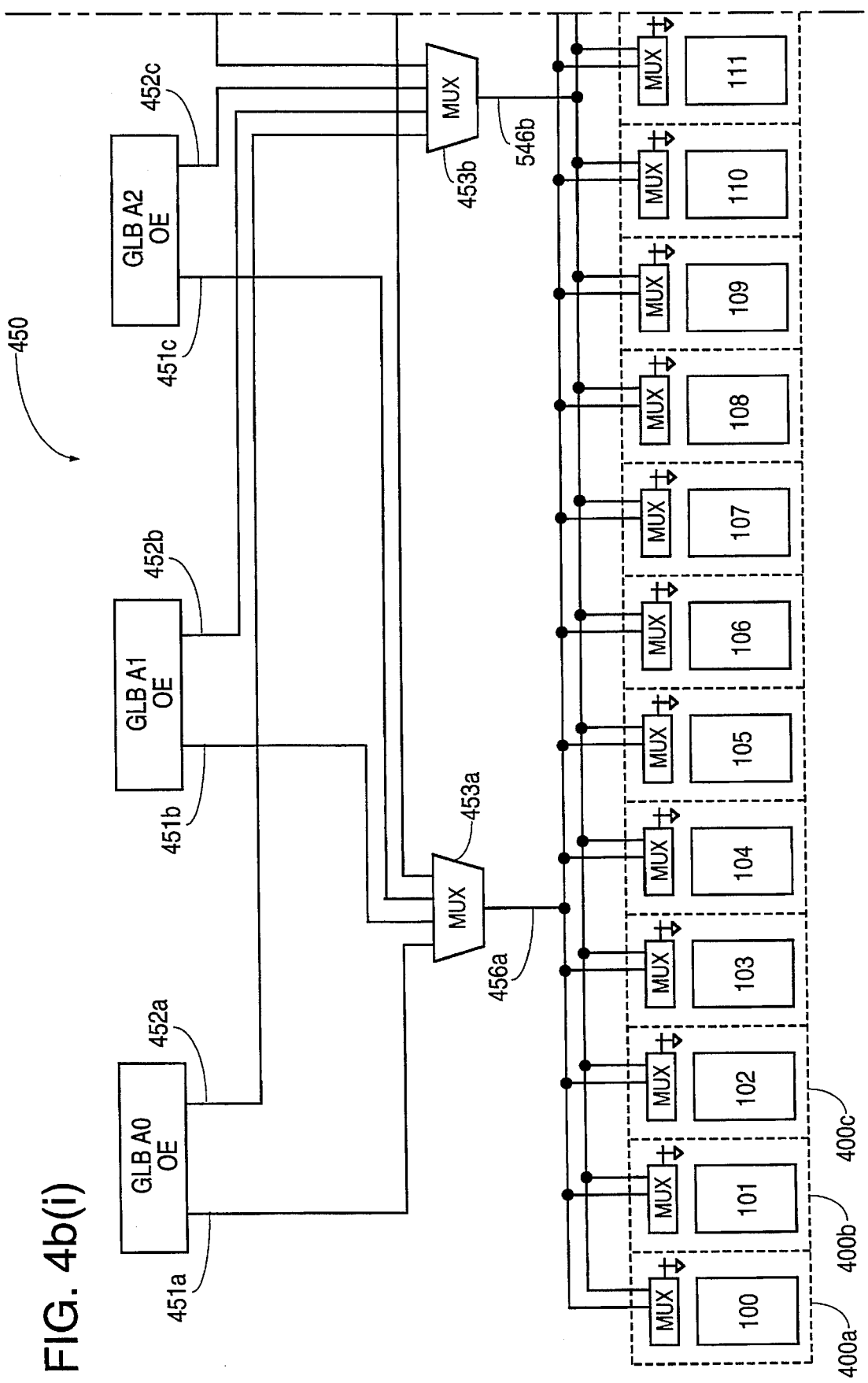
FIG. 4b shows the output enable structure of a megablock 450, in accordance with the present invention.

FIG. 4b shows in further detail the output enable signals generated by GLBs in a megablock 450. As shown in FIG. 4b, megablock 450 comprises GLBs A0–A3. Each of GLBs A0–A3 provides two output enable signals. These output enable signals, which are shown in FIG. 4b as signals on leads 451a–451d and 452a–452d, are designated product term output enable signals ("PTOEs"). Two of these PTOEs are provided to the I/O cells of the megablock, which are shown in FIG. 4b as I/O cells 400a–400p. Multiplexer 453a selects one of the PTOEs on leads 451a–451d to provide an output enable signal on lead 456a, and multiplexer 453b selects one of the PTOEs on leads 452a–452d to provide a second output enable signal on lead 456b.

Figure 4C:
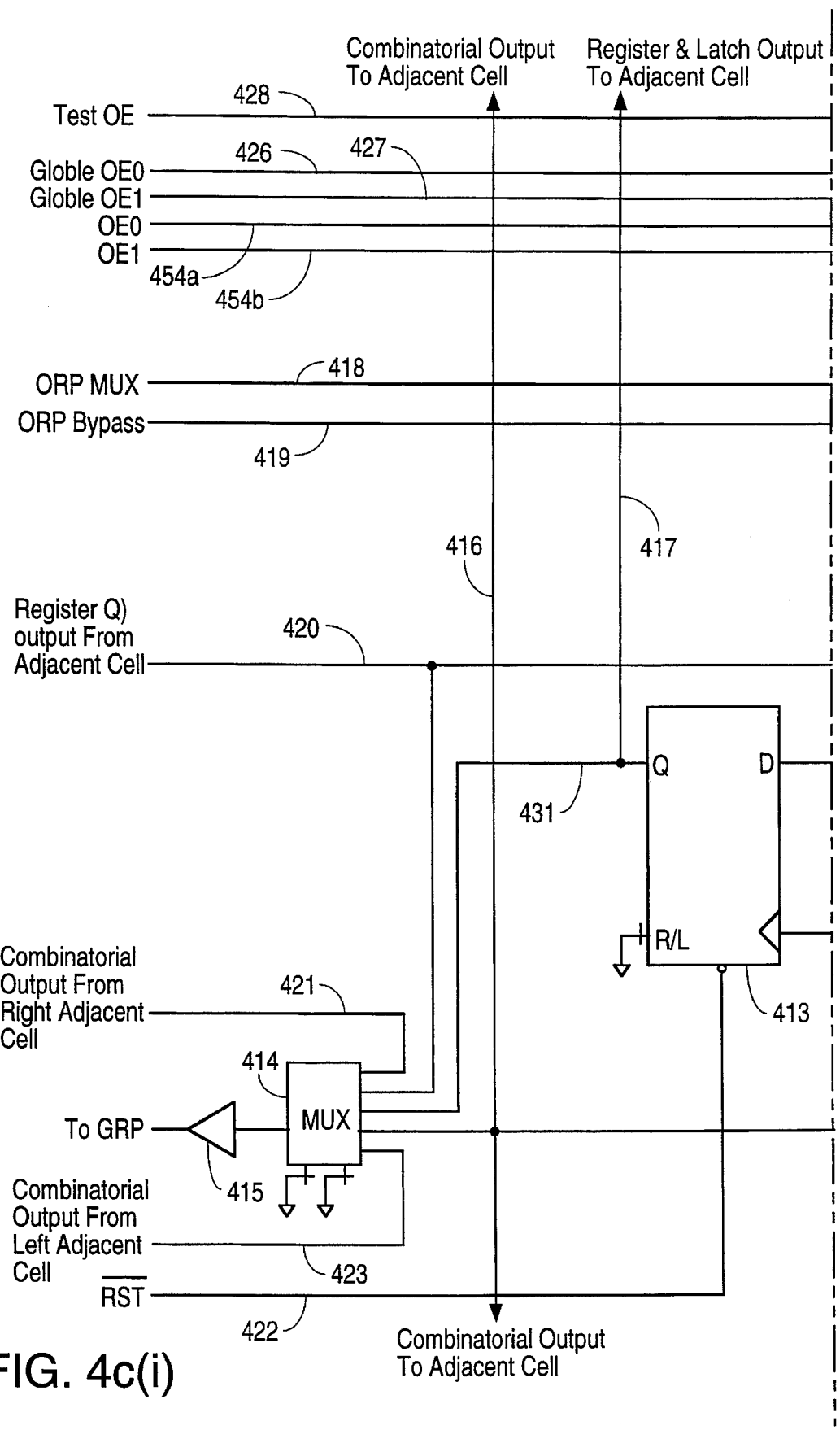
FIG. 4c shows an I/O cell 400, including the output enable structure of the present invention.
Figure 4D:
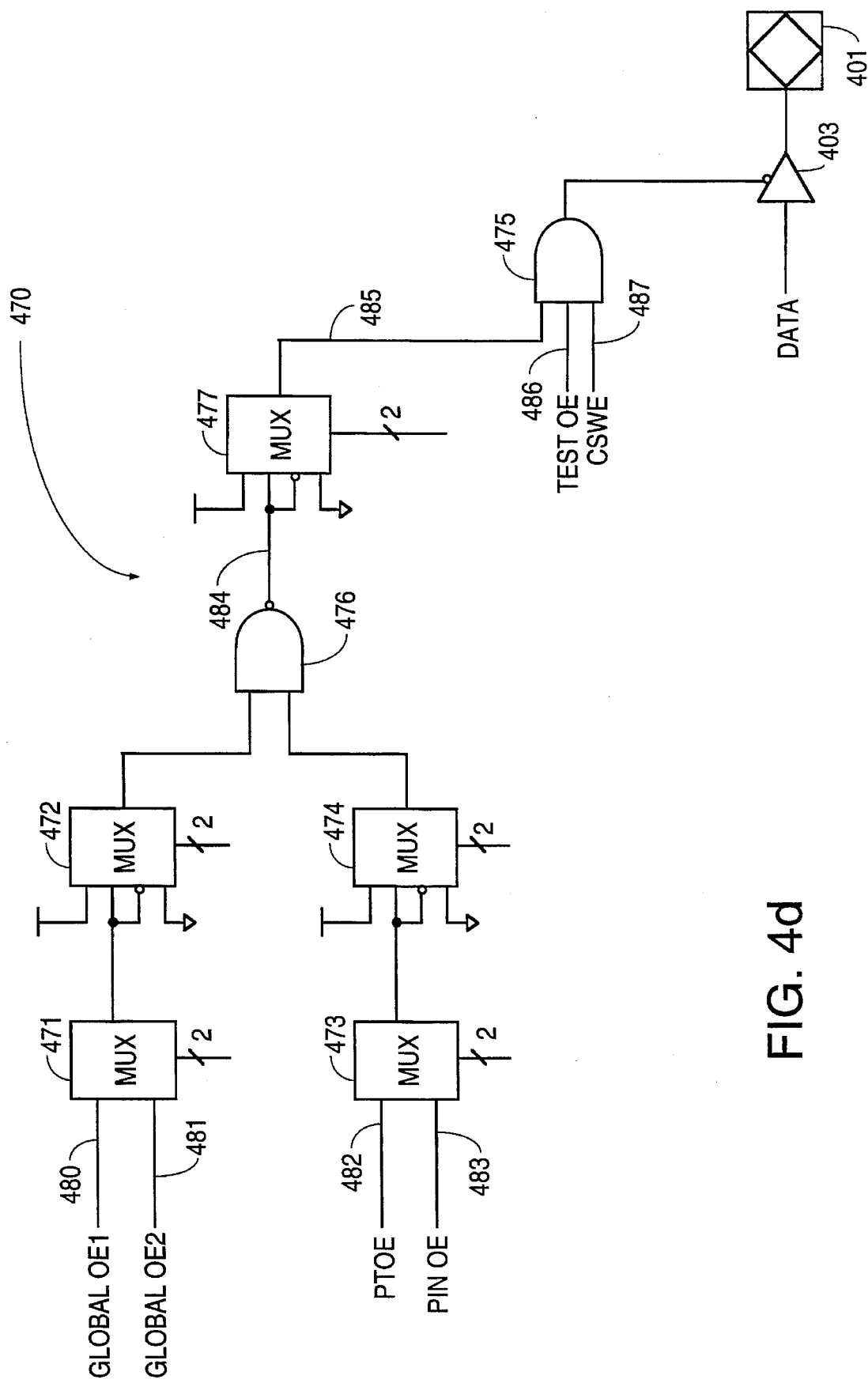
FIG. 4d shows a control circuit 470 which can be used to provide the output enable signal for output buffer 403 of I/O cell 400.
Figure 1A:
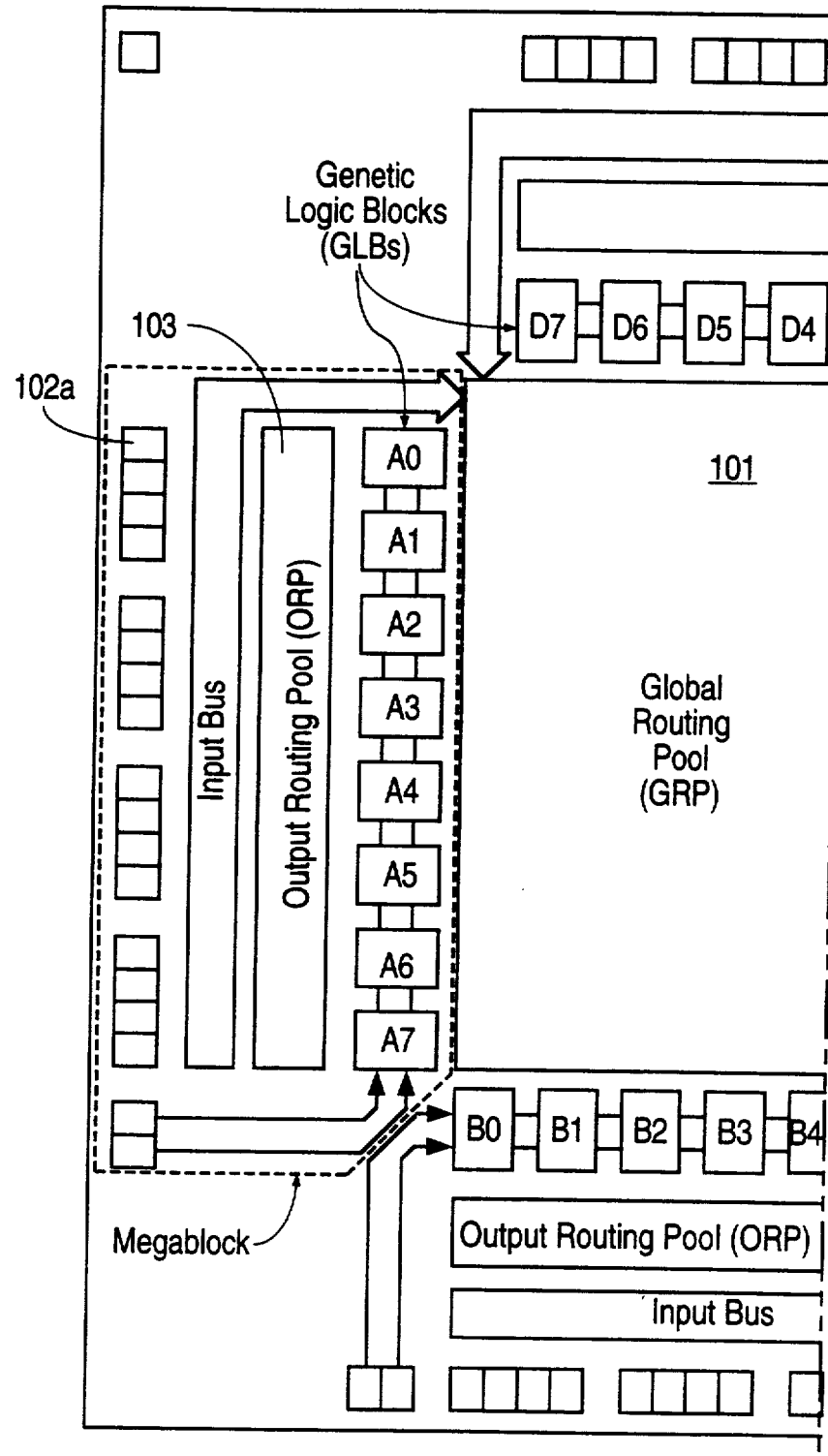

FIG. 4c shows an I/O cell 400, which is representative of I/O cells 400a–400p shown in FIG. 4b. As shown in FIG. 4, I/O cell 400 receives the output enable signals on leads 454a and 454b, and two global output enable signals on leads 426 and 427. The output enable signals on leads 454a and 454b are selected from either PTOE signals generated in any macroblock of programmable logic device, or input signals received from I/O pins and routed through the GRP 201. The two global output enable signals are output enable signals received at dedicated output enable pins in programmable logic device 200 and routed through GRP 201 to every I/O cell in programmable logic device 200.

Multiplexer 424 selects, on lead 429, for I/O cell 400 an output enable signal from among the output enable signals on leads 454a and 454b, and the global output enable signals on leads 426 and 427. This output enable signal on lead 429 and its complement can be used to control output at I/O cell 400. Multiplexer 407 can also be programmed to unconditionally enable and disable output by I/O cell 400. The output signal of multiplexer 407 is ORed with a test output enable signal TEST OE on lead 428, to provide a capability to enable data output under test mode. The test enable signal TEST OE is received into programmable logic device 200 through a dedicated I/O pin, which may be loaded by a relatively large capacitor. The relatively large capacitor ensures a slow rise time for signal TEST OE, when programmable logic device 200 powers up. A slow rise time in the TEST OE signal disables output at the I/O pins until initialization is complete.

Data output reaches I/O cell 400 through output routing pool, such as output routing pool 204l, to multiplexer 408, which is programmed to select from either the standard signal path through output routing pool 204l, or a bypass connection, such as one of the bypass connections shown in FIG. 2d. The output data or its complement is provided by multiplexer 404 to buffer 403 for output through input/output pin 401. An optional programmable pullup can be configured at input/output pin 401 to prevent propagation of noise when output buffer 403 is in the high impedance state.

When configured for receiving an input signal, I/O cell 400 provides the input signal to the remainder of programmable logic device 200 as either a "combinational" input (i.e. asynchronous) signal, or a "registered" input (i.e. synchronous) signal. Synchronization is provided by register 413 which is clocked by one of two clock signals received from the clock distribution network 206. The clock signal for register 413 is selected by programming multiplexers 411. Multiplexer 412 provides a choice between the selected clock signal and its complement. In this embodiment, an additional level of signal routing is provided by routing the registered input signal to an a neighboring I/O cell, and routing the combinational input signal to two neighboring I/O cells. Multiplexer 414 receives the registered input signal on lead 430, the combinational input signal on lead 431, two combinational input signal from two neighboring I/O cells on lead 421 and 423, and a registered input signal from a neighboring I/O cell on lead 420. The output signal of multiplexer 414 is routed to the associated LRP as an input signal received by programmable logic device 200. Because an input signal received from I/O pin 401 into I/O cell 400 can be routed to at least two neighboring I/O cells, additional level flexibility in pin-out configuration is achieved for programmable logic device 200.

The above detailed description is illustrative of the specific embodiments of the present invention and is not intended to be limiting. Many modifications and variations within the scope of the present invention are possible. The programming of the multiplexing of the output enable signals can be implemented in either volatile or non-volatile memory technology. Using in-system programming techniques, the programming of the PTOEs and the multiplexing of the output enable signals can be reprogrammed in-system without removal of the integrated circuit from its circuit board. In-system programming techniques are discussed in U.S. Pat. Nos. 4,855,954 (entitled "In-system Programmable Logic Device with Four Dedicated Terminals" to Turner et al, issued Aug. 8, 1989), 4,761,768 (entitled "Programmable Logic Device", to Turner et al, issued Aug. 2, 1988), and 4,896,296 (entitled "Programmable Logic Device Configurable Input/Output Cell", to Turner et al, issued Jan. 23, 1990). The in-system programming techniques discussed in these U.S. Patents are hereby incorporated by reference.

The present invention is defined by the following claims. We claim:

1. A structure for providing programmable output enable signals in a programmable logic device, comprising:

a plurality of megablocks, each megablock including a plurality of programmable logic blocks, and a plurality of input/output cells for receiving input signals and providing output signals, each of said plurality of programmable logic blocks providing an internal output enable signal for controlling said output signals of said input/output cells; and means for routing each of said internal output enable signals to each of said plurality of megablocks.

2. A structure as in claim 1, further comprising:

a global routing resource; and means for receiving into said programmable logic device an external output enable signal and for routing said external output enable signal through said global signal routing resource to said input/output cells.

3. A structure as in claim 2, further comprising a first multiplexor programmed to select an output enable signal among (i) one or more of said internal output enable signals and (ii) said external output enable signal.

4. A structure as in claim 3, further comprising a second multiplexor programmed to select as an I/O cell output enable signal one of: (a) said selected output enable signal, (b) a complement signal to said selected output enable signal, (c) a logic high signal and (d) a logic low signal.

5. A structure as in claim 1, wherein said programmable logic device comprises circuits fabricated using volatile memory technology.

6. A structure as in claim 1, wherein said programmable logic device comprises circuits fabricated using non-volatile memory technology.

7. A structure for providing programmable output enable signals in a programmable logic device, comprising:

a plurality of megablocks, each megablock including a plurality of programmable logic blocks, and a plurality of input/output cells for receiving input signals and providing output signals, each of said plurality of programmable logic blocks providing an internal output enable signal for controlling said output signals of said input/output cells;

means for routing each of said internal output enable signals to each of said plurality of megablocks;

a first multiplexor programmed to select an output enable signal among (i) one or more of said internal output enable signals and (ii) said external output enable signal;

means for receiving into said programmable logic device a test signal, said test signal having an active state and an inactive state; and means for disabling propagation of said selected output enable when said test signal is in said inactive state.

8. A structure for providing programmable output enable signals in a programmable logic device, said programmable logic device having a plurality of logic blocks, a plurality of input/output cells and a global signal routing resource, said global signal routing resource comprising a programmable interconnect circuit, said structure comprising:

means for receiving into said programmable logic device an external output enable signal and for routing said external output enable signal through said global signal routing resource to said input/output cells;

means for receiving from one of said logic blocks an internal output enable signal and for routing said internal output enable signal over said global signal routing resource to any of said input/output cells; and a logic circuit, receiving as input signals said internal and external output enable signals, for providing a logic function of said internal and external output enable signals.

9. A structure as in claim 8, wherein said internal output enable signal is selected from a number of output enable signals each generated by one of said logic blocks, each of said logic blocks generating at least one of said output enable signals.

10. A structure as in claim 8, further comprising a multiplexor programmed to select as an I/O cell output enable signal one of: (a) an output enable signal representing said logic function, (b) a complement signal to said output enable signal, (c) a logic high signal and (d) a logic low signal.

11. A structure for providing programmable output enable signals in a programmable logic device, said programmable logic device having a plurality of logic blocks, a plurality of input/output cells and a global signal routing resource, said global signal routing resource comprising a programmable interconnect circuit, said structure comprising:

means for receiving into said programmable logic device an external output enable signal and for routing said external output enable signal through said global signal routing resource to said input/output cells;

means for receiving from one of said logic blocks an internal output enable signal and for routing said internal output enable signal over said global signal routing resource to any of said input/output cells;

a logic circuit, receiving as input signals said internal and external output enable signals, for providing a logic function of said internal and external output enable signals;

a multiplexor programmed to select as an I/O cell output enable Signal one of: (a) an output enable signal representing said logic function, (b) a complement signal to said output enable signal, (c) a logic high signal and (d) a logic low signal;

means for receiving into said programmable logic device a test signal; and means for disabling propagation of said output enable signal when said test signal is in an inactive state.

12. A method for providing programmable output enable signals in a programmable logic device, comprising the steps of:

including in each of a plurality of megablocks (i) a plurality of programmable logic blocks, and (ii) a plurality of input/output cells for receiving input signals and providing output signals, each of said plurality of programmable logic blocks providing an internal output enable signal for controlling said output signals of said input/output cells; and routing each of said output enable signals to each of said plurality of megablocks.

13. A method as in claim 12, comprising the steps of:

receiving into said programmable logic device an external output enable signal; and routing said external output enable signal through using a global signal routing resource to said input/output cells.

14. A method as in claim 12, further comprising the step of selecting an output enable signal between said internal and external output enable signals.

15. A method as in claim 14, further comprising a second selecting step for selecting as an I/O cell output enable signal one of: (a) said selected output enble signal, (b) a complement signal to said selected output enable signal, (c) a logic high signal and (d) a logic low signal.

16. A method for providing programmable output enable signals in a programmable logic device, comprising the steps of:

including in each of a plurality of megablocks (i) a plurality of programmable logic blocks, and (ii) a plurality of input/output cells for receiving input signals and providing output signals, each of said plurality of programmable logic blocks providing an internal output enable signal for controlling said output signals of said input/output cells;

routing each of said output enable signals to each of said plurality of megablocks;

selecting an output enable signal between said internal and external output enable signals;

receiving into said programmable logic device a test signal; and disabling propagation of said selected output enable when said test signal is in an inactive state.

17. A method for providing programmable output enable signals in a programmable logic device, said programmable logic device having a plurality of logic blocks, a plurality of input/output cells and a global signal routing resource, said global signal routing resource comprising a programmable interconnect circuit, said method comprising the steps of:

receiving into said programmable logic device an external output enable signal;

routing said external output enable signal through said global signal routing resource to said input/output cells;

receiving from one of said logic blocks an internal output enable signal;

routing said internal output enable signal over said global signal, routing resource to any of said input/output cells; and providing a logic function of said internal and external output enable signals.

18. A method as in claim 17, wherein said internal output enable signal is selected from a number of output enable signals each generated by one of said logic blocks, each of said logic blocks generating at least one of said output enable signals.

19. A method as in claim 17, further comprising the step of selecting as an I/O cell output enable signal one of: (a) an output enable signal representing said logic function, (b) a complement signal to said output enable signal, (c) a logic high signal and (d) a logic low signal.

20. A method for providing programmable output enable signals in a programmable logic device, said programmable logic device having a plurality of logic blocks, a plurality of input/output cells and a global signal routing resource, said global signal routing resource comprising a programmable interconnect circuit, said method comprising the steps of:

receiving into said programmable logic device an external output enable signal;

routing said external output enable signal through said global signal routing resource to said input/output cells;

receiving from one of said logic blocks an internal output enable signal;

providing a logic function of said internal and external output enable signals;

selecting as an I/O cell output enable signal one of: (a) an output enable signal representing said logic function, (b) a complement signal to said output enable signal, (c) a logic high signal and (d) a logic low signal;

receiving into said programmable logic device a test signal; and disabling propagation of said output enable signal when said test signal is in an inactive state.

* * * * *

UNITED STATES PATENT AND TRADEMARK OFFICE
CERTIFICATE OF CORRECTION

PATENT NO. : 5,506,517

DATED : April 9, 1996

INVENTOR(S) : Tsui et al

It is certified that error appears in the above-identified patent and that said Letters Patent is hereby corrected as shown below:

In the Drawings Fig. 1A(i), change the line stemming from 103 to point at box entitled "Output Routing Pool (ORP)" and in Fig. 2a-(i), change the word "RESOURCE" to --POOL--, as shown on the attached pages.

Signed and Sealed this

Eighth Day of April, 1997

Attest:

BRUCE LEHMAN

Attesting Officer

Commissioner of Patents and Trademarks

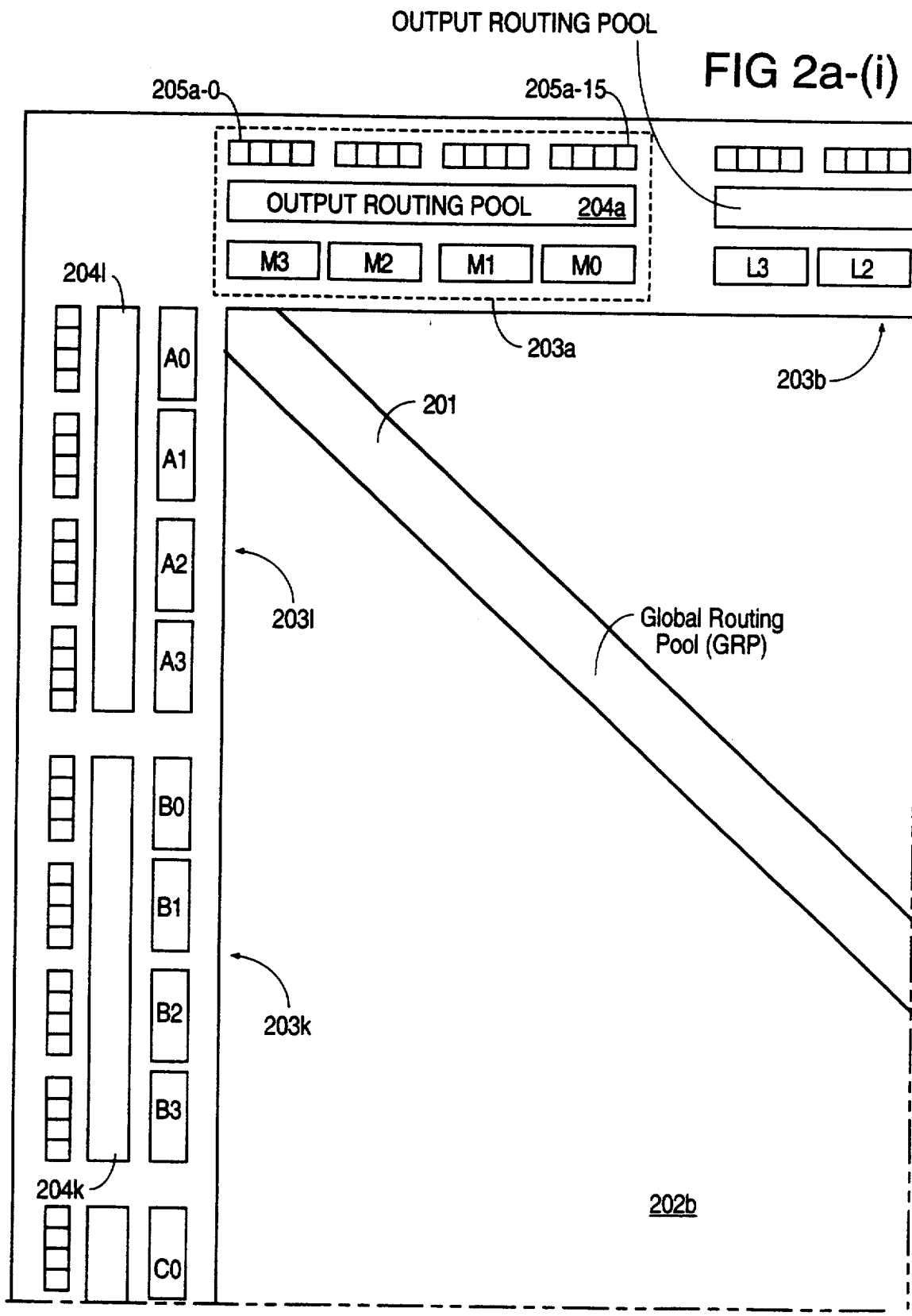

UNITED STATES PATENT AND TRADEMARK OFFICE
CERTIFICATE OF CORRECTION

PATENT NO.   :   5,506,517
DATED        :   April 9, 1996
INVENTOR(S)  :   Tsui et al.

It is certified that error appears in the above-identified patent and that said Letters Patent is hereby corrected as shown below:

```
Col. 1 line 61, change "macroblock" to --megablock--.
Col. 1 line 63, change "macroblock" to --megablock--.
Col. 1 line 66, change "macroblock" to --megablock--.
Col. 1 line 67, change "macroblock" to --megablock--.
Col. 2 line 3, change "macroblock" to --megablock--.
Col. 2 line 11, in both occurrences of "macroblock" change
to  --megablock--.
Col. 2 line 15, change "macroblock" to --megablock--.
Col. 2 line 18, change "macroblocks" to --megablocks--.
Col. 2 line 19, change "macroblock" to --megablock--.
Col. 2 line 23, change "macroblock" to --megablock--.
Col. 2 line 27, change "macroblock" to --megablock--.
Col. 3 line 27, change "macroblocks" to --megablocks--.
Col. 3 line 28, change "macroblocks" to --megablocks--.
Col. 3 line 31, change "macroblock" to --megablock--.
Col. 5 line 42, change "macroblocks" to --megablocks--.
Col. 5 line 45, change "macroblocks" to --megablocks--.
Col. 5 line 46, change "macroblocks" to --megablocks--.
Col. 5 line 50, change "macroblock" to --megablock--.
Col. 5 line 52, change "macroblock" to --megablock--.
Col. 5 line 53, change "macroblocks" to --megablocks--.
Col. 5 line 57, change "macroblocks" to --megablocks--.
Col. 5 line 59, change "macroblocks" to --megablocks--.
Col. 5 line 60, change "macroblock" to --megablock--.
Col. 6 line 8,  change "FIG.4," to --FIG. 4c,--.
Col. 6 line 13, change "macroblock" to --megablock--.
```